United States Patent
Maone

(10) Patent No.: US 7,498,851 B2
(45) Date of Patent: Mar. 3, 2009

(54) HIGH SPEED COMPARATOR

(75) Inventor: Francesco Maone, Zürich (CH)

(73) Assignee: NXP B.V., Eindhoven (NL)

( * ) Notice: Subject to any disclaimer, the term of this patent is extended or adjusted under 35 U.S.C. 154(b) by 225 days.

(21) Appl. No.: 10/578,052

(22) PCT Filed: Jan. 3, 2005

(86) PCT No.: PCT/IB2005/050009

§ 371 (c)(1),
(2), (4) Date: Jul. 12, 2006

(87) PCT Pub. No.: WO2005/069488

PCT Pub. Date: Jul. 28, 2005

(65) Prior Publication Data

US 2007/0116407 A1 May 24, 2007

(30) Foreign Application Priority Data

Jan. 13, 2004 (EP) .................................. 04100089

(51) Int. Cl.
*H03K 5/22* (2006.01)
(52) U.S. Cl. ........................................ 327/65; 327/563
(58) Field of Classification Search ............. 327/65–67, 327/560–563; 330/252–253
See application file for complete search history.

(56) References Cited

U.S. PATENT DOCUMENTS

| 4,644,185 | A | * | 2/1987 | Todd | 327/208 |
| RE36,781 | E | * | 7/2000 | Lee et al. | 327/65 |
| 6,400,215 | B1 | * | 6/2002 | Yamaguchi | 327/543 |
| 6,714,079 | B2 | * | 3/2004 | Dessard et al. | 330/256 |

FOREIGN PATENT DOCUMENTS

JP 05114826 A * 5/1993

* cited by examiner

*Primary Examiner*—Quan Tra

(57) ABSTRACT

The invention relates to a comparator with a constant duty cycle for high frequency data signals. Such comparators are often part of an integrated circuit and particularly useful in the mobile phone technology. To achieve the desired constant duty cycle for high frequency data signals, the comparator according to the invention comprises a differential amplifier (M1, M2) having differential inputs (IN 1, IN2) forming the comparator inputs and a first and second amplifier output (Vo, Vo−) forming the comparator outputs of a first comparator stage. Further, a first differential current amplifier (A11) is provided and connected with its inputs to the amplifier outputs (Vo, Vo−) and with its output to the first amplifier output (Vo). Finally, a second differential current amplifier (A12) is connected with its inputs to the amplifier outputs (Vo, Vo−) and with its output to the second amplifier output (Vo−).

9 Claims, 4 Drawing Sheets

HIGH SPEED COMPARATOR

The invention relates to a comparator for high frequency data signals, which comparator may be part of an integrated circuit and particularly useful in the mobile phone technology.

Many applications, not only in the mobile phone sector, require a high speed comparator which switches whenever a comparison succeeds. Often, the signals to be handled are differentials and the comparison consists in a conversion "double/single ended" format. "Double ended" means in this context that the comparator deals with two signals in counter-phase, whereas "single ended" means that only one output signal including the result of the comparison is provided by the comparator. Naturally, for processing/comparing fast signals, the comparator has to be sufficiently fast, i.e. usually faster than the signal sequence to follow the signal input variations. Moreover, when the operative frequency increases, constraints on setup/hold time become key points for the functionality of the whole system. Under such circumstances, it is a mandatory requirement at system—level to keep the internal clock duty-cycle as close as possible to 50% for an interface between the external and the internal signals of an integrated circuit (IC) domain.

The duty cycle is here used to describe the characteristics of an electrical signal and is particular relevant to signals having a digital or rectangular waveform. Digital or rectangular waveforms alternate between a low level and a high level or phase, with the transition between levels occurring substantially instantaneously. The term period refers to the duration of a single cycle. The duty cycle of a digital signal is generally defined as the ratio between the high phase and the period of the digital signal; it is usually stated as a percentage. For example, a digital signal having a pattern of 20% high phase has a 20/100 duty cycle. Generally it is desirable that the duty cycle of a digital clock signal be a "pure 50% cycle", such a pure 50% duty cycle having a waveform with equal high and low portions.

Figure 1:
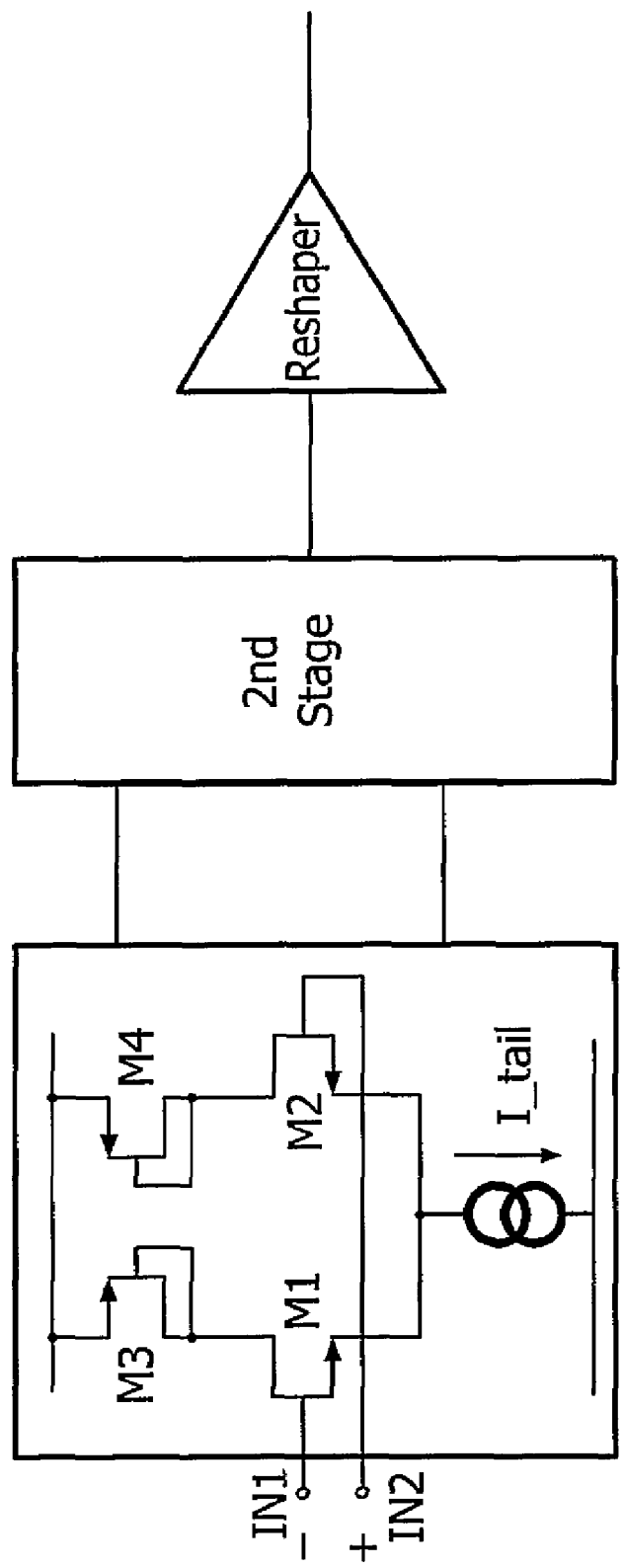

To achieve the desired high performance, i.e. a high comparison rate or speed of a comparator, it is known to use operational amplifiers with two or more stages. FIG. 1 shows a block diagram of a conventional architecture for a two stage comparator. The first stage is formed by a differential amplifier, illustrated in FIG. 1 on the left. Its two differential inputs IN1 and IN2 are conducted to the control inputs of a first and a second transistor M1 and M2, respectively. The first input terminal IN1 can be used as inverting input and the second input terminal IN2 can be used as non-inverting input of the differential amplifier. The outputs of the first and second transistor M1 and M2 are connected between a constant current source providing a constant tail current I_tail and two further transistors M3 and M4 working as load diodes. This first stage is followed by a second stage comprising an output amplifier. In order to reduce the total current consumption, a class-AB output stage may be chosen as second stage, especially because of its high current efficiency. The second stage may then be connected to a signal reshape unit.

This signal reshape unit is a circuit which makes the output of the class AB stage compliant to a digital signal, e.g. by means of an inverter stage. This is particularly useful in case of high-speed operative conditions. In such cases, it could happen that the class-AB stage provides a sinusoidal-shaped output waveform. The reshape unit performs then a squaring of the above mentioned output, making it compatible with any following digital circuit.

Unfortunately, to speed up the whole comparator, i.e. adapt it to high processing speed, a high tail current I_tail is required at the first stage. There are two reasons for that: The first reason is that a high gain is necessary. The second reason is that the sensitivity to small signal variations at the inputs IN1 and IN2 must be sufficiently large.

For a high speed operation, the decision process inside the input stage should be done fast: the earlier the decision on the small signal variations at the inputs IN1 and IN2 is made the faster is the system.

A further problem arises in the second stage. When this second stage has switched completely, at least one of its transistors gets out of its active region, and more often even turns off. Then, this transistor needs some time to recover, introducing or necessitating a "recovery time" for the second stage. This "recovery time" will always be needed after a long static state. Obviously, this slows the whole comparator down.

Thus, it is an object of the invention to provide a high speed comparator with low power consumption, especially a comparator which can easily be adapted for implementation into an integrated circuit. Such integration also requires that the power consumption of a suitable comparator must be held to a minimum.

A particular object is to devise a comparator which does not only provide the gain necessary for the function, but also sufficient sensitivity to small variations of the input.

A further object is to design a high speed, high sensitive comparator for a large input range at low power consumption.

The objects above are solved by a comparator with the features according to an embodiment of the invention. In brief, a comparator according to the invention comprises two amplifier stages: A differential amplifier is provided having differential inputs forming the comparator inputs and a first and second amplifier output, these forming the comparator outputs of a first comparator stage. The second stage includes two differential amplifiers: A first differential current amplifier connected with its inputs to the amplifier outputs and with its output to the first amplifier output, and a second differential current amplifier connected with its inputs to the amplifier outputs and with its output to the second amplifier output.

The dependent claims identify further advantageous features and developments of the invention.

In one embodiment of the invention, the comparator according to the invention comprises a second comparator stage having an output amplifier whose inputs are connected to the comparator outputs of the first comparator stage and whose output forms the comparator output of the second comparator stage.

In another embodiment of the invention, the comparator according to the invention further comprises a switching means whose control input is connected to the comparator output of the second comparator stage and its control output to the first output of the differential amplifier. Thus, the variation of the duty cycle of the comparator signal can be decreased.

As a further improvement to the comparator, the switching means is a transistor which advantageously may be connected to the one output of the differential amplifier whose output signal needs longer to reach the comparator output of the second comparator stage.

In another preferred embodiment of the comparator according to the invention, the switching means is in series connected to a current mirror transistor, whereby the current mirror transistor is provided to adjust a determined current flowing through the switching means.

Also, the differential amplifier of the comparator according to the invention may comprise a first and a second input transistor whose control outputs are connected to an auxiliary current source. With that, the high performance of the comparator can be maintained even for a very low supply voltage.

As a further variation, the auxiliary current source of the comparator may be connected via a current mirror to the input transistors and, even further, this current mirror may be connected via a further current mirror to the input transistors.

Even further, the auxiliary current source of the comparator is connectable via a switching transistor to the current mirror.

Advantageously, the switching transistor of the comparator may be arranged to be switched on whenever the supply voltage falls under a predetermined reference voltage.

Additional objects and advantages of the invention will be evident from the subsequent description or may become apparent when practicing the invention.

Subsequently, the invention is further explained with the drawings showing in

Figure 2:
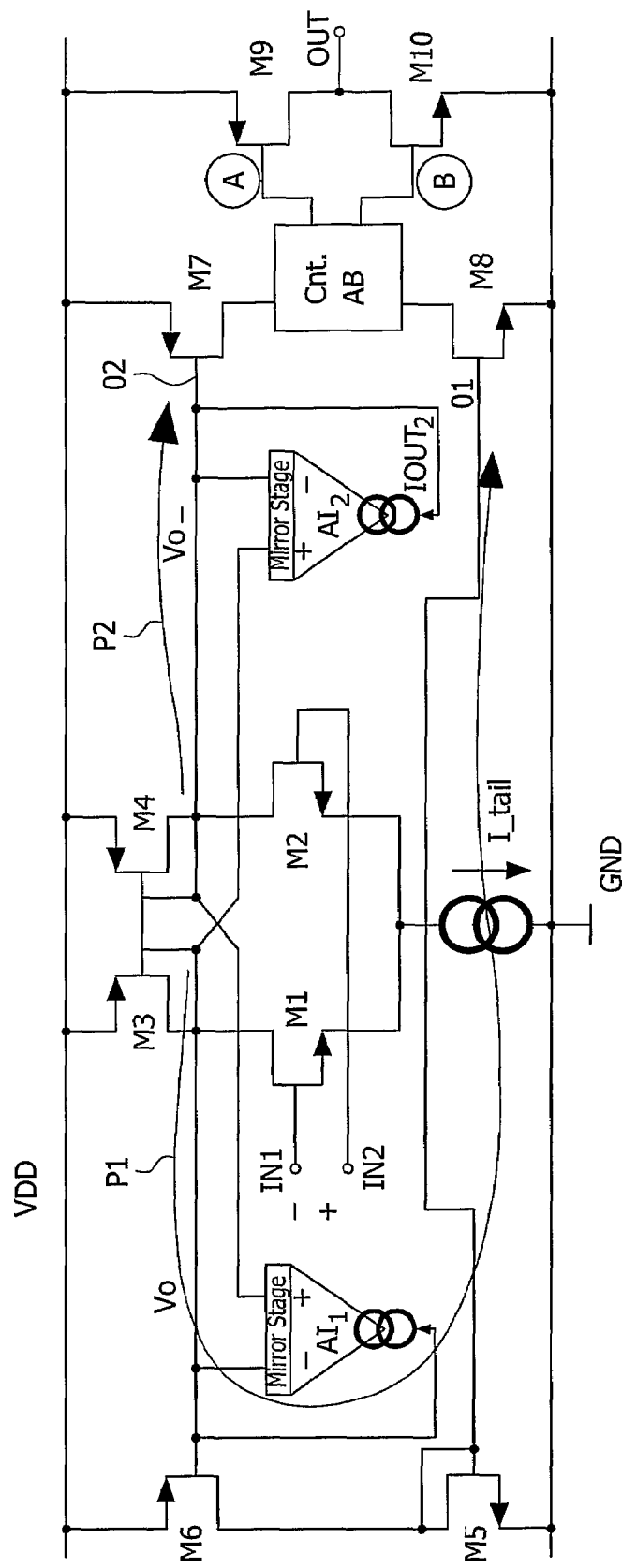
Figure 3:
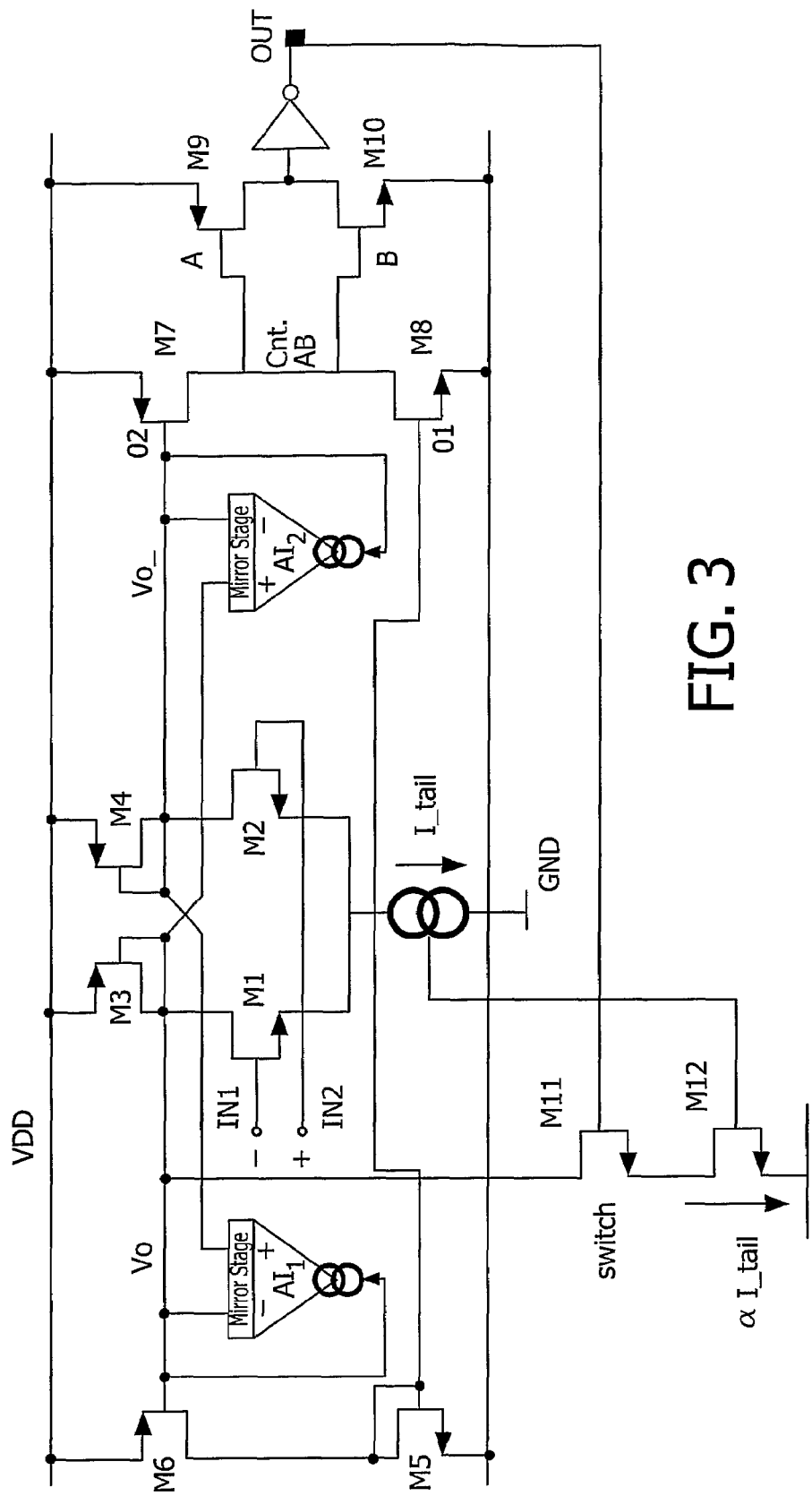
Figure 4:
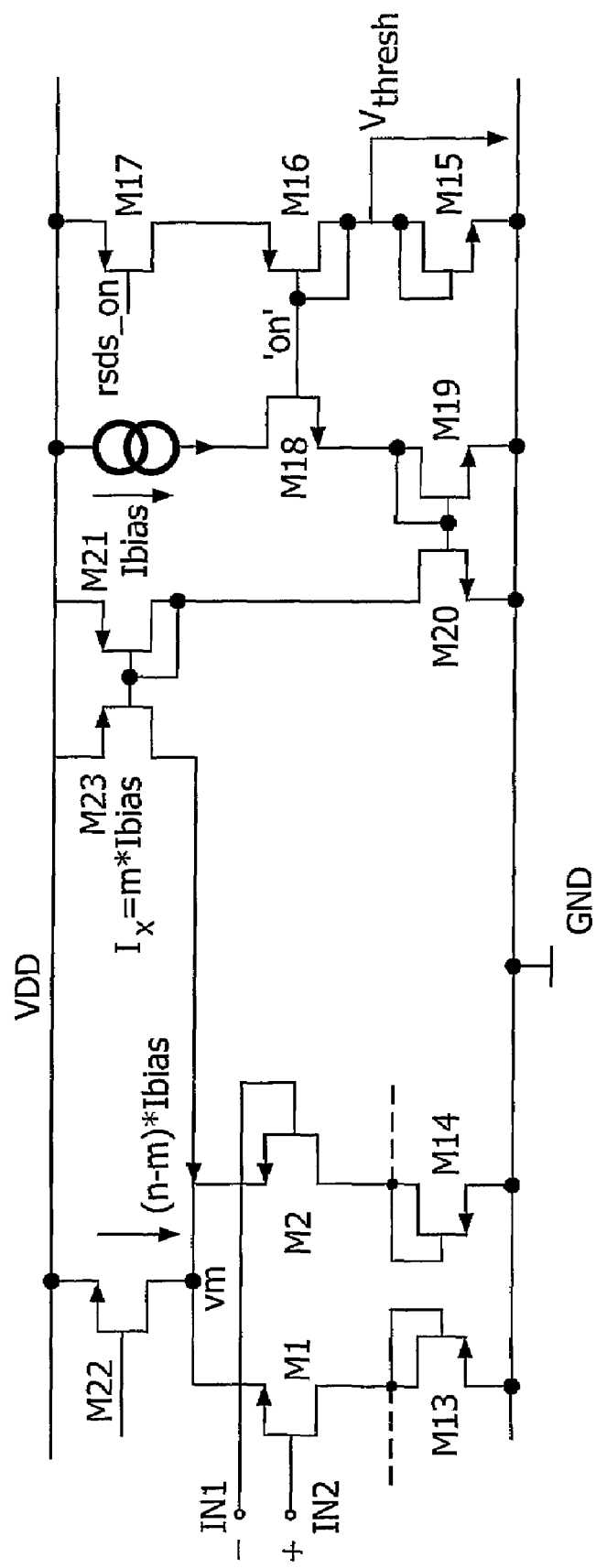

FIG. 1 a schematic diagram of an embodiment of a comparator according to the prior art;

FIG. 2 a schematic diagram of a first embodiment of a comparator according to the invention;

FIG. 3 a schematic diagram of a second embodiment of the comparator according to the invention; and FIG. 4 a schematic diagram of a third embodiment of the comparator according to the invention.

FIG. 1 shows a block diagram of a conventional two-stage comparator circuit. This conventional circuit is explained above in the section "Background of the invention".

FIG. 2 illustrates a first embodiment of the invention. The comparator circuit shown there is in principle a two stage comparator. The first comparator stage includes a differential amplifier M1 and M2 and two differential current amplifiers A11 and A12. The second comparator stage is an output amplifier and includes the transistors M7 to M10.

The differential amplifier of the first comparator stage has two input transistors M1 and M2 whose control inputs are coupled to the inputs IN1 and IN2 of the comparator. The first input terminal IN1 can be used as inverting input and the second input terminal IN2 as non-inverting input of the differential amplifier. The outputs of the first and second transistor M1 and M2 are connected between a constant current source providing a constant tail current I_tail and two further transistors M3 and M4 working as load diodes. So far, the differential amplifier has a same structure similar to the prior art differential amplifier shown in FIG. 1.

The significant difference is that the first comparator stage additionally includes a first and a second differential current amplifier $Al_1$ and $Al_2$. The two inputs of the first differential current amplifier $Al_1$ are coupled to the outputs Vo and Vo−, respectively, of the differential amplifier. The same applies to the inputs of the second differential current amplifier $Al_2$.

The output of the first differential current amplifier $Al_1$ is connected to the first output Vo of the differential amplifier, whereas the output of the second differential current amplifier $Al_2$ is connected to the second output Vo− of the differential amplifier. The common output of the differential amplifier and the first differential current amplifier $Al_1$ are connected to the control input of the transistor M6. One of the control outputs of this transistor M6 is connected to the supply voltage VDD, while the other control output of this transistor M6 is connected to the control output of the transistor M5, the latter functioning as diode, and to the control input of the transistor M8. The control output of the transistor M6 is usable as first output O1 of the first comparator stage. The common output of the differential amplifier and the second differential current amplifier $Al_2$ forms the second output O2 of the first comparator stage.

The control inputs of the transistors M7 and M8 of the second comparator stage are connected to the outputs O1 and O2 of the first comparator stage. The transistors M7 and M8, respectively, are used to connect the supply voltage VDD or ground GND to the output amplifier. At the output OUT of the output amplifier, the comparator signal, which is the result of the comparison between the signal voltages at inputs IN1 and IN2, can be picked off.

The comparator illustrated in FIG. 2 works as follows: The current is boosted trough the second comparator stage only when necessary. A residual current is used to prevent that the transistors in the second comparator stage are completely switched off. By means of a positive current feedback, the transistors M3 and M4, which work as load, are then forced by an additional current to be "soft on". This is explained further below. The result is that the controlling voltages for the second comparator stage are speeded up. The residual current keeps on flowing even after the transition is completed, as explained in the following.

The differential current amplifiers $Al_1$ and $Al_2$ are sourced by the currents flowing through the transistors M3 and M4 and are mirrored by the transistors of the same size inside the differential current amplifiers $Al_1$ and $Al_2$. The transfer function of the current amplifiers $Al_1$ and $Al_2$ is:

$$I_{OUT} = \begin{pmatrix} \alpha(Iplus - Iminus) \\ 0 \end{pmatrix} \begin{vmatrix} Iplus \geq Iminus \\ Iplus < Iminus \end{vmatrix}$$

wherein

Iplus is the current at the non-inverting input of the differential current amplifier $Al_1$ or $Al_2$, Iminus is the current at the inverting input of the differential current amplifier $Al_1$ or $Al_2$, and $I_{OUT}$ is the output current of $Al_1$ or $Al_2$.

Suppose that a positive voltage step occurs at the negative input IN1 while on the positive input IN2 it does not. Hence the current flowing through the load transistor M3 increases; the second current amplifier $Al_2$ senses this difference and provides an output current IOUT2 proportional to the difference between the currents IM3 and IM4, wherein IM3 is the current flowing through the transistor M3 and IM4 is the current flowing through the transistor M4. An extra negative current is spilled from the transistor M4 and results in a small increase in the absolute value of the drain-source voltage Vds4, while the drain-source voltage Vds2 decreases, forcing transistor M1 to draw a small current from transistor M2. This small current contributes to the total residual current in transistor M3 increasing it, thus accelerating this positive feedback. When the transaction is completed, the residual negative current still flows on transistor M4 and thus versus the output O2. This so-called "soft on" helps the next switching phase because transistor M4 is not completely switched off.

In the prior art embodiment according to FIG. 1, the transistor M4 would have been completely switched off, i.e. the current IM4 through transistor M4 would be zero. After a long static state, it would take some time to switch on the transistor M4 in the prior art embodiment according to FIG. 1.

In case of a positive voltage step at the positive input IN2, the behavior of the comparator circuit is in principle the same as described above. But now, instead of the transistor M4, the transistor M3 is switched "soft on".

To reduce the total current consumption, a class-AB operational amplifier may be chosen because of its high current efficiency at the output stage. The output stage uses current only when a transition takes place, in all other cases only a quiescent current is flowing through the output stage.

Overall, the comparator as shown in FIG. 2 operates at high speed and has a lower current consumption than the embodiment shown in FIG. 1.

The double-mirrored operational amplifier shown in FIG. 2 may have an intrinsic asymmetry in the output waveform due to the different path length from the input to the output stage, indicated by the two arrows P1 and P2 in FIG. 2. The particular path which includes more transistors than the other path, is defined as the longer path. Obviously this is the path P1 in the embodiment shown in FIG. 2. The asymmetry may result in an unbalanced duty cycle having a duty cycle variation $\delta_{CLK}$.

In certain cases, this variation $\delta_{CLK}$ may become a problem with respect to the functionality of the whole system. For instance, in applications like mLVDS/RSDS interfacing, i.e. when interfacing "mini low voltage differential signals" (mLVDS) and "reduced swinging differential signals" (RSDS), since both protocols work on the rising and falling edges of the clock and the setup/hold specifications are intended for both transitions, a large duty cycle variation $\delta_{CLK}$ may complicate the fitting of the specifications.

FIG. 3 shows a comparator that solves this problem. This comparator includes a digital speed-up of the slower path P1 to overcome the above-mentioned limitation. Thus the duty cycle variation $\delta_{CLK}$ can be kept in a reasonable range of about +/−5% as function of the supply voltage, temperature and process spreading.

In the following, the working principle of the comparator shown in FIG. 3 is explained. Suppose that a voltage step occurs at the positive input IN2 while it does not occur at the negative input IN1. After a propagation time through the short path P2, the output OUT of the second comparator stage switches to "on". Due to that, the switch transistor M11 turns on, enabling a current sinking from the load transistor M3. If nothing happens, the circuit stays in this new state, and charges all parasitic elements in the long path P1. In fact, the increased current flowing through the transistor M3 is mirrored and forced in the path P1 by the mirror chain. The mirror chain consists of the transistors M6, M5 and M8 and mirrors the current over the transistors M6 and the transistor M5 to the transistor M8.

As soon as the input changes, the voltage step on the negative input terminal IN1 forces the second comparator stage to switch, but from a starting point at which the slow path P1 is already speeded up. This allows to compensate the delay introduced by the double-mirror architecture.

For this purpose, according to FIG. 3, a switching transistor M11 and a current mirror transistor M12 are provided, both being connected in series and coupled to the output Vo of the differential amplifier. The control input of the switching transistor M11 is controlled by the output OUT of the second comparator stage, while the current mirror transistor M12 is controlled by the current source I_tail. The current mirror transistor M12 provides a current αI_tail following through the switching transistor M11, if it is switched on.

An additional reason for the duty cycle variation $\delta_{CLK}$ can be the wide voltage range in which the circuit has to operate. First of all, to make the comparator fast and able to sense small input variations, the tail current I_tail must be high enough because it influences the gain of the input transistors M1 and M2 and thus the bandwidth. Unfortunately, when the supply voltage VDD is very low, e.g. <2.3 V, a high current could force the input pair of transistors M1 and M2 into their linear region, especially when the common-mode voltage VCM is close to its low boundary. In this condition, a big offset is introduced and thus the duty cycle variation $\delta_{CLK}$ increases.

The above mentioned weak situation becomes even worse for the mLVDS interface for which the working current is higher then the RSDS. A solution for adapting the current to this kind of interface to the supply voltage VDD and to the common-mode level VCM is compulsory to avoid large duty-cycle variations $\delta_{CLK}$.

When the supply voltage VDD is smaller then the threshold voltage $V_{thresh}$ fixed by the transistors M2 and M3, no current flows through the transistors and the "on" signal is unable to switch the transistor M18 on. The additional current Ix flowing through the transistor M23 is then zero. Lowering the current at low supply voltage VDD prevents the pair of input transistors M1 and M2 to reach their linear region and thus the offset increases.

For this purpose, the current source Ibias is exploited for providing all the necessary currents all over the circuit. This current source, which is connected via a transistor M18 to a first current mirror consisting of transistors M19 and M20, provides the voltage-dependent part of the tail current, now flowing through M22. A second current mirror consisting of transistors M21 and M23 provides the voltage-independent part of the tail current for the input transistors M1 and M2. When the supply voltage VDD is lower then the threshold voltage $V_{thresh}$, the transistor M18 is switched off. Subsequently, the auxiliary current Ibias does not flow through the current mirror transistor M19, thus the current Ix=m*Ibias at the output of the second current mirror M21, M23 is not delivered. Then, the current (n−m)*Ibias is flowing through the transistor M22.

As explained before, by reducing the current in the input stage at low supply voltage Vdd, one prevents that the input transistors M1 and M2 get into their linear region, contributing to an offset increase. In this latter case, if the offset due to the input stage is larger, the moment when the comparator will decide the final result is different from the ideal case in which the duty-cycle is 50%. This is the reason why it is necessary to lower the current in the input stage so that the offset is minimized or even eliminated.

Having illustrated and described several preferred embodiments for a novel comparator protection means for an integrated circuit, it is noted that variations and modifications in the device and the method can be made without departing from the core of the invention or the scope of the appended claims.

REFERENCE NUMBER LIST

IN1 first input
IN2 second input
VDD supply voltage
GND ground or reference potential
$V_{thresh}$ threshold voltage
Ibias bias current
IOUT2 output current of A12
M1 first input transistor
M2 second input transistor
M3 first load
M4 second load
M5-M23 transistors
AI1 first current amplifier
AI2 second current amplifier
P1 long signal path
P2 short signal path
O1 first output of the first comparator stage O2 second output of the first comparator stage
OUT output of the second comparator stage

The invention claimed is:

1. A comparator, comprising:
   a differential amplifier having differential inputs forming the comparator inputs, and a first and second amplifier output forming the comparator outputs of a first comparator stage;
   a first differential current amplifier connected with its inputs to said amplifier outputs and connected with its output to said first amplifier output;
   a second differential current amplifier connected with its inputs to said amplifier outputs and connected with its output to said second amplifier output;
   a second comparator stage having an output amplifier whose inputs are connected to the comparator outputs of the first comparator stage and whose output forms the comparator output of said second comparator stage; and
   switching means whose control input is connected to the comparator output of the second comparator stage and whose control output is connected to the first output of the differential amplifier.

2. The comparator according to claim 1, wherein the switching means is a transistor.

3. The comparator according to claim 1, wherein the switching means is connected to the output of the differential amplifier whose output signal needs longer to reach the comparator output of the second comparator stage.

4. The comparator according to claim 1, wherein the switching means is in series connected to a current mirror transistor said current mirror transistor being provided to adjust a predetermined current flowing through said switching means.

5. The comparator according to claim 1, wherein the differential amplifier comprises a first and a second input transistor whose control outputs are connected to an auxiliary current source.

6. The comparator according to claim 5, wherein the auxiliary current source is connected via a current mirror to the input transistors.

7. The comparator according to claim 6, wherein the current mirror is connected via a further current mirror to the input transistors.

8. The comparator according to claim 7, wherein the auxiliary current source is connectable via a switching transistor to the current mirror.

9. The comparator according to claim 8, wherein the switching transistor is provided to be switched off, when the supply voltage falls under a certain reference voltage.

* * * * *